(12) United States Patent
Yokoya et al.

(10) Patent No.: US 8,526,186 B2
(45) Date of Patent: Sep. 3, 2013

(54) ELECTRONIC ASSEMBLY INCLUDING DIE ON SUBSTRATE WITH HEAT SPREADER HAVING AN OPEN WINDOW ON THE DIE

(75) Inventors: Satoshi Yokoya, Nice (FR); Margaret Rose Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 233 days.

(21) Appl. No.: 13/180,085

(22) Filed: Jul. 11, 2011

(65) Prior Publication Data

US 2013/0016477 A1    Jan. 17, 2013

(51) Int. Cl.
*H05K 7/20* (2006.01)
*H01L 23/24* (2006.01)
*H01L 21/60* (2006.01)

(52) U.S. Cl.
USPC ............. 361/719; 361/679.46; 361/679.54; 361/704; 361/715; 165/80.3; 165/104.33; 165/185; 174/15.2; 174/16.3; 174/252; 257/98; 257/712; 257/713; 257/686; 257/698; 257/706; 257/E21.506; 438/22; 438/26; 438/106; 438/122

(58) Field of Classification Search
USPC ....... 361/679.46, 679.54, 690, 692, 704–712, 361/715–724; 257/686, 698, 706–713, 718–727, 774, 777, 257/79, 81, 98, E21.001, E21.101, E21.499, 257/E21.506, E21.536, E21.529, E21.602; 165/80.3, 104.33, 185; 174/15.2, 16.3, 252–257; 438/17, 22, 26, 438/82, 98, 106–112, 122, 400; 29/825–854
See application file for complete search history.

(56) References Cited

U.S. PATENT DOCUMENTS

| | | | |
|---|---|---|---|
| 7,592,697 B2 * | 9/2009 | Arana et al. | 257/714 |
| 7,960,843 B2 * | 6/2011 | Hedler et al. | 257/777 |
| 8,183,578 B2 * | 5/2012 | Wang | 257/79 |
| 8,390,009 B2 * | 3/2013 | Wang | 257/98 |
| 2009/0280602 A1 | 11/2009 | Bonifield et al. | |
| 2010/0178766 A1 | 7/2010 | Andry et al. | |
| 2010/0187670 A1 * | 7/2010 | Lin et al. | 257/686 |
| 2010/0213600 A1 | 8/2010 | Lau et al. | |
| 2011/0042795 A1 | 2/2011 | Knickerbocker | |
| 2011/0079916 A1 | 4/2011 | West | |

* cited by examiner

*Primary Examiner* — Michail V Datskovskiy
(74) *Attorney, Agent, or Firm* — Steven A. Shaw; W. James Brady; Frederick J. Telecky, Jr.

(57) ABSTRACT

An electronic assembly includes a workpiece, a through substrate via (TSV) die including a substrate and a plurality of TSVs, a topside and a bottomside having TSV connectors thereon. The TSV die is attached to the workpiece with its topside on the workpiece. A heat spreader having an inner open window is on the bottomside of the TSV die. Bonding features are coupled to the TSV connectors or include the TSV connectors themselves. The bonding features protrude from the inner open window to a height above a height of the top of the heat spreader that allows a top die to be bonded thereto.

20 Claims, 7 Drawing Sheets

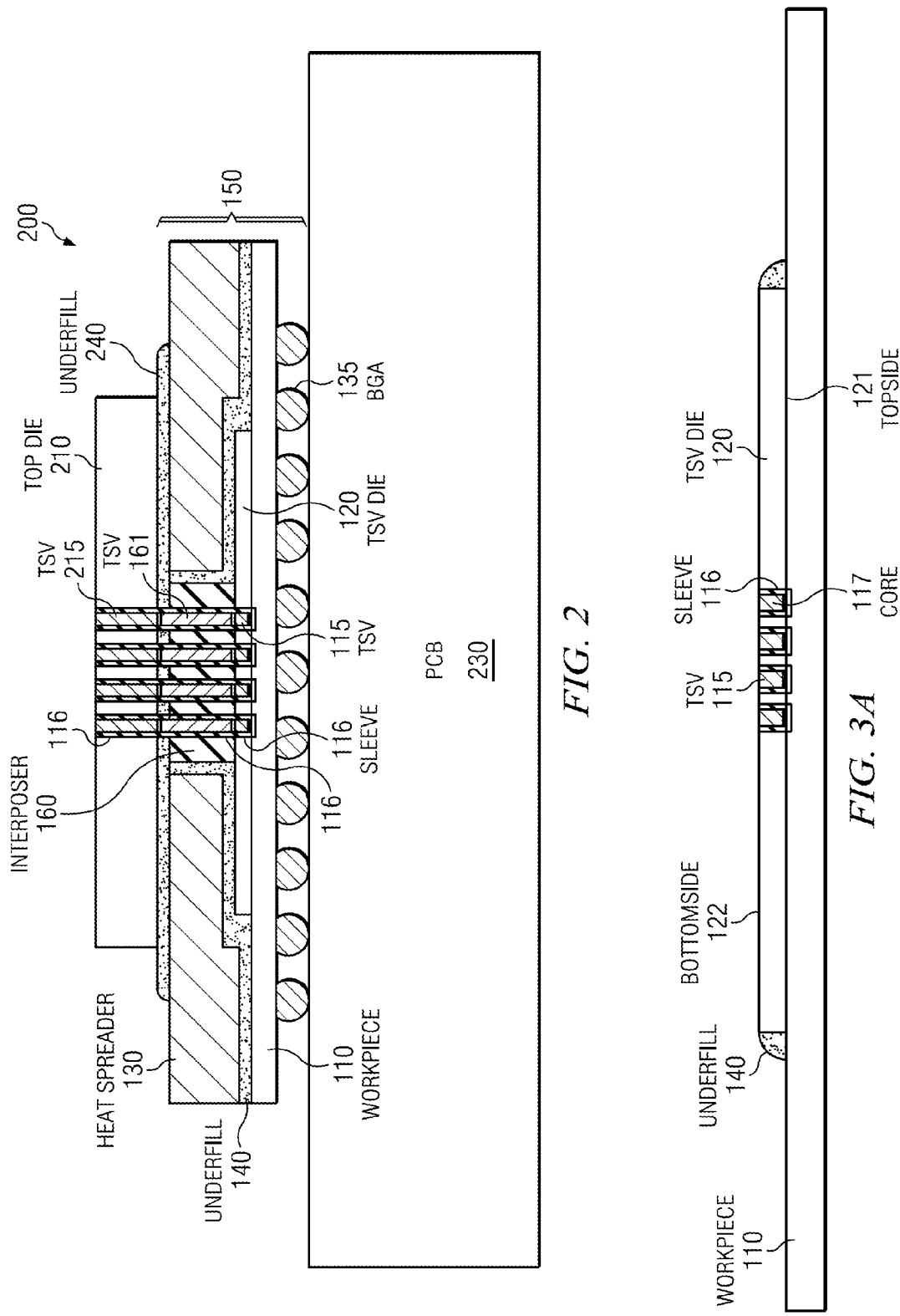

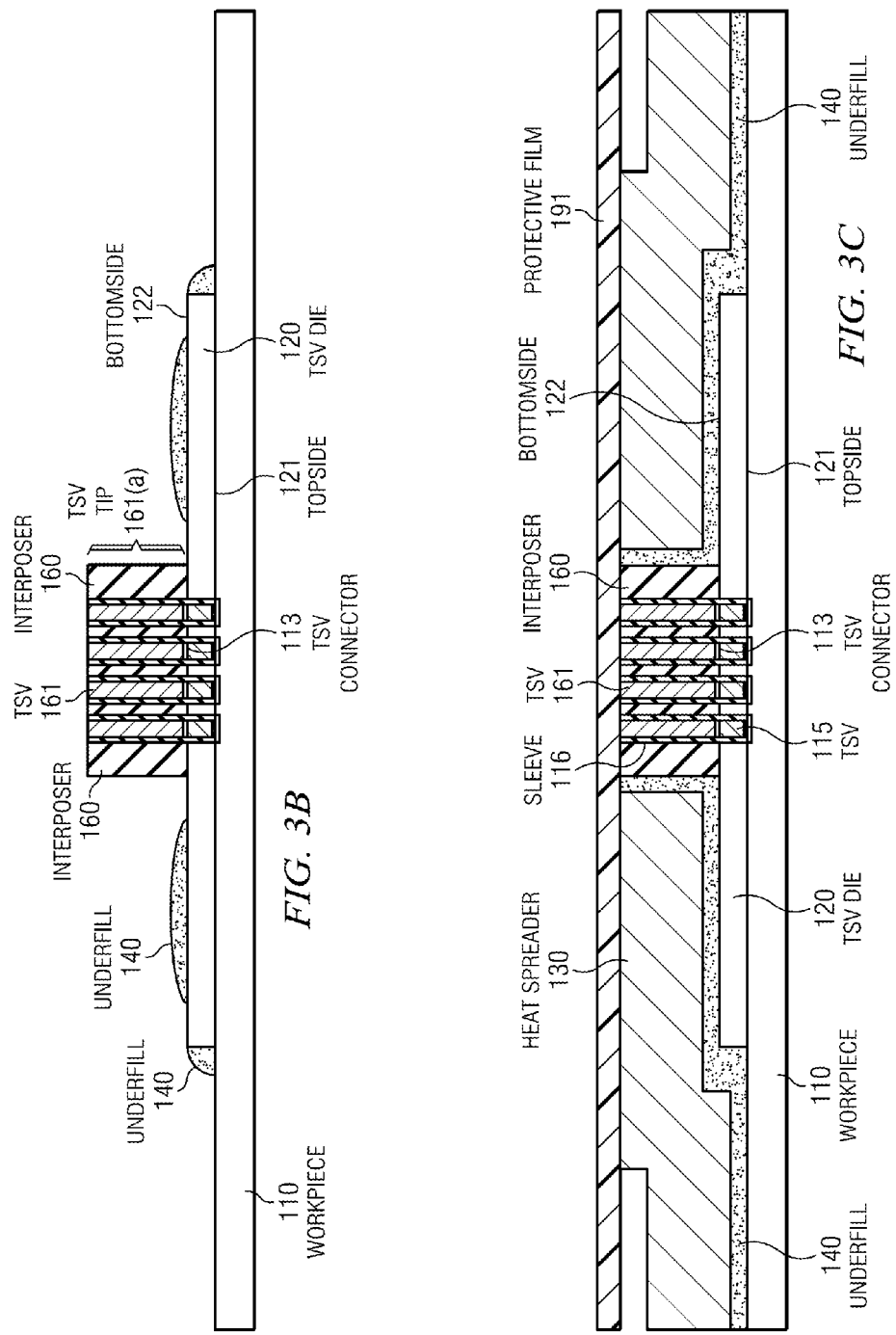

ELECTRONIC ASSEMBLY INCLUDING DIE ON SUBSTRATE WITH HEAT SPREADER HAVING AN OPEN WINDOW ON THE DIE

FIELD

Disclosed embodiments relate to system in package (SIP) precursors including heat spreaders for enhanced cooling, and stacked die SIPs therefrom.

BACKGROUND

A SIP includes a number of integrated circuits (ICs) enclosed in a single package or module. The SIP performs all or most of the functions of an electronic system, and is commonly used inside products including mobile phones, personal digital assistants (PDAs) and digital music players. In a SIP, individual ICs can be stacked vertically (3D arrangements) or arranged horizontally. ICs can be internally connected by fine wires that are bonded to the package. Alternatively, with a flip-chip technology, solder bumps are used to join stacked chips together.

Some SIPS comprise die that include through silicon vias or more generally through substrate vias (referred to herein as "TSV die"), such as a logic/processor die, where the TSVs are arranged in one or more TSV arrays that provide vertical connections through the full thickness of the TSV die. TSVs allow vertical stacking of multiple die, and interconnecting them without using conventional wire bonding or flip-chip bumping. For example, TSVs can be used for stacking up a series of memory chips and can provide a signal path or heat transfer path between the die.

Some TSVs include protruding TSV tips that protrude from the bottomside (non-active side) of the TSV die. Such TSV die are often thin, such as 30 µm to 80 µm in thickness. Thin TSV die are prone to warpage which can result in unreliable connections to the TSVs. For a consistent and reliable connection, flatness of such TSV die should generally be kept within a few µms over the full area of the TSV die.

In one process for forming SIPs including thin TSV die, thin TSV die can be bonded to another die for mechanical support before bonding the TSV die attached to the other die to a substrate. For example, a singulated TSV die may be attached to a memory die (or module) using a flat carrier, followed by the TSV die/memory die being attached to a substrate, such as an organic substrate. In another SIP formation process, a TSV die is bonded to a substrate, followed bonding a top die to the TSV die. In either case, the substrate can include a ball grid array (BGA), and the SIP may be attached to a printed circuit board (PCB).

There are several disadvantages to these known SIP processes. It is not possible to test the TSV die before attaching the top die (e.g., memory die). Therefore, failure of the TSV die or connections from the TSV die to the substrate can cause yield loss including the scrap of good to die (e.g., memory die). The end-user may also demand different memory density for their system (4 Gb, 8 Gb 16 Gb, etc.), creating a need to develop multiple SIP products. SIP vendors have to also purchase memory and keep memory devices in inventory.

Another problem for stacked die SIPs is heating due to power dissipation during operation. Recently, as computing performance has increased, power consumption of the TSV die has increased. Individual ICs in the SIP, such as a memory die on top of the TSV die, may become overheated if cooling is not properly and adequately provided. The space between individual ICs in the die stack may also be too small for providing cooling channels because the gaps are generally too small for fluid flow. A heat spreader can be attached on top of the top die (e.g., memory die) in a stacked SIP, but this is not an efficient cooling arrangement since the thermal resistance of the top die prevents efficient power dissipation from the TSV die, and heating of the top die (e.g., memory die) causes higher power consumption for the SIP system.

SUMMARY

Disclosed embodiments describe electronic assemblies that include a through substrate via (TSV) die including a plurality of TSVs, a topside including active circuitry and a bottomside having TSV connectors thereon. The TSV die is attached with its topside on a workpiece with its bottomside facing up. A heat spreader having an inner open window (i.e., aperture) is on the bottomside of the TSV die. Bonding features are coupled to the TSV connectors, or include the TSV connectors themselves. The bonding features protrude from the inner open window to a height above a height of the top of the heat spreader that allows a top die (e.g., memory die) to be bonded to the TSV die.

Upon assembly of a top die to form a SIP, the heat spreader is thus between the TSV die and top die. By positioning the heat spreader between the TSV die and the top die, the cooling efficiency is significantly enhanced due to a lower thermal resistance heat transfer path compared to conventional heat spreaders that are attached on top of the top die as described above. The heat spreader can also add mechanically stability and stiffness, helping prevent warpage of the generally thin TSV die (e.g., 40 µm to 80 µm) on the workpiece.

In one embodiment the TSV connectors comprise protruding TSV tips. In this embodiment the bonding features comprise the protruding TSV tips. In another embodiment, the bonding features comprise an interposer that includes a plurality of TSVs that are coupled to the TSV connectors, such as pads that are coupled to the TSVs on the TSV die by a redistribution layer (RDL) on the bottomside of the TSV die.

BRIEF DESCRIPTION of the DRAWINGS

FIG. 2 is a cross sectional depiction of a stacked die SIP that comprises the electronic assembly shown in FIG. 1B having a top die thereon, wherein the workpiece includes a ball grid array (BGA) that is coupled to a printed circuit board (PCB), according to an example embodiment.

FIGS. 3A-C shows cross sectional depictions following sequential steps in an example assembly flow to form a plurality of the electronic assemblies shown in FIG. 1B, according to an example embodiment.

DETAILED DESCRIPTION

Figure 1A:
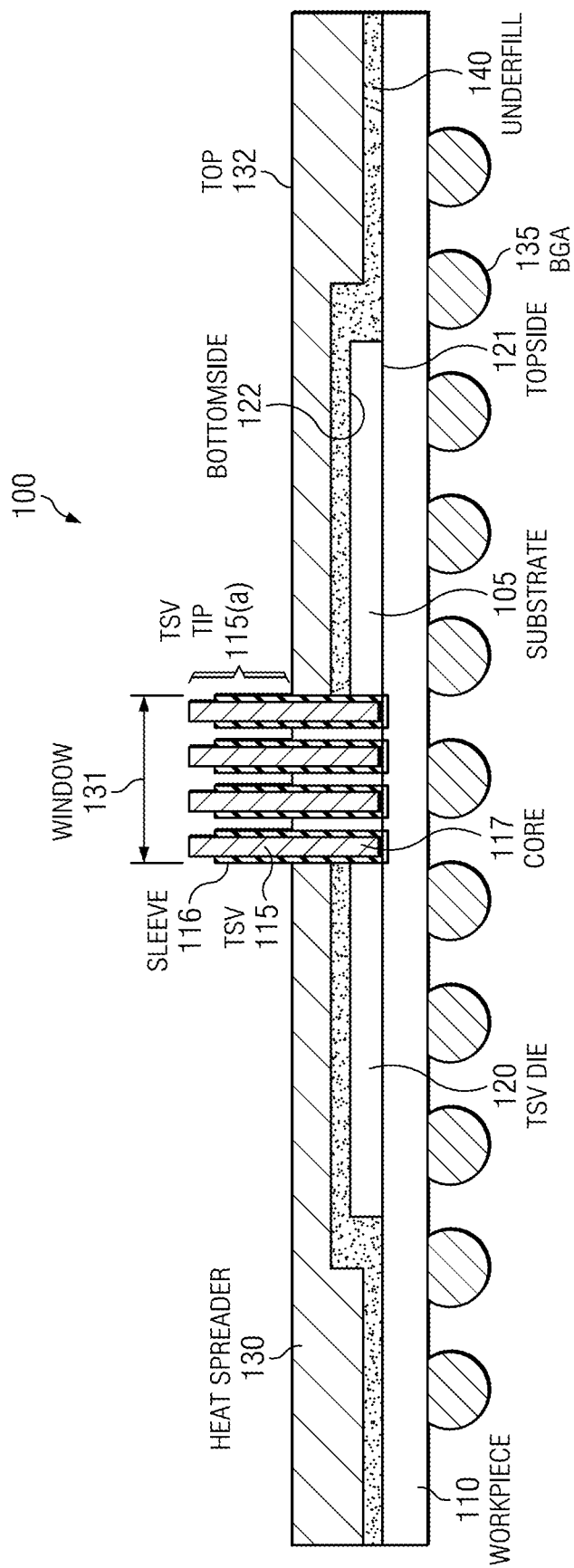
FIG. 1A is a cross sectional depiction of an example electronic assembly including a workpiece, a TSV die attached to the workpiece topside down, a heat spreader having an inner open window on the bottomside of the TSV die, and bonding features shown as protruding TSV tips that protrude from the open window to a height above a height of the top of heat spreader, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a depiction of an example electronic assembly 100 including a workpiece 110, a TSV die 120 attached with its topside 121 down onto the workpiece 110, according to an example embodiment. TSV die 120 comprises a substrate 105, a plurality of TSVs 115 including protruding TSV tips 115(a) including a metal core 117 framed by a dielectric sleeve 116, with its topside 121 including active circuitry (not shown), such as comprising transistors. In the embodiment shown the TSV connectors are provided by the protruding TSV tips 115(a) which also provide the bonding features on the bottomside 122 of the TSV die. A metal diffusion barrier layer (e.g., refractory metal comprising) on the dielectric sleeve 116 will generally be present when the metal core 117 comprises minority lifetime killing metals such as copper, is not shown for simplicity. Moreover, dielectric layers on the topside 121 and bottomside 122 of the TSV die 120 are also not shown for simplicity.

Workpiece 110 can comprise a package substrate, such as an organic substrate. The frontside 121 of TSV die 120 in one embodiment includes solder capped metal pillars that are attached to contact pads on the surface of the workpiece 110. A heat spreader 130 having an inner open window (aperture) 131 is on the bottomside 122 of the TSV die 120. The protruding TSV tips 115(a) can be seen to protrude from the inner open window 131 to a height above a height of the top 132 of the heat spreader 130 to provide bonding features. Underfill 140 is provided between the heat spreader 130 and the TSV die 120, and between the heat spreader 130 and the workpiece 110. The workpiece 110 is shown including a BGA 135 on its side opposite to the TSV die 120.

Heat spreader 130 generally comprises a metal or a metal alloy, such as copper or a copper alloy. Other example materials for the heat spreader 130 include aluminum, aluminum/silicon/copper, nickel and tungsten. The non-planar shape for the heat spreader 130 can be provided by a variety of different methods, such as by stamping. The open window 131 of the heat spreader 130 can be aligned to the position of the protruding TSV tips 115(a) using a variety of methods including a fiducial system, such as the conventional system used to align flip chip die for a bonding or a self-alignment scheme.

In this embodiment, the heat spreader 130 functions as the backbone of the electronic assembly 100. To minimize mechanical stress from the workpiece 110 to the heat spreader 130 a soft material (such as a thermally conductive elastomer with an appropriate coefficient of thermal expansion (CTE)) can be used as the underfill 140.

In one embodiment the TSV tips 115(a) are 6 to 30 μm long, and the thickness of the heat spreader 130 over the TSV die 120 is 2 to 5 μm less than the length of the TSV tips 115(a). Although not shown in FIG. 1A, the TSV tips 115(a) can include a metal capping layer tip finish, such as Ni/Au in one particular embodiment.

Figure 1B:
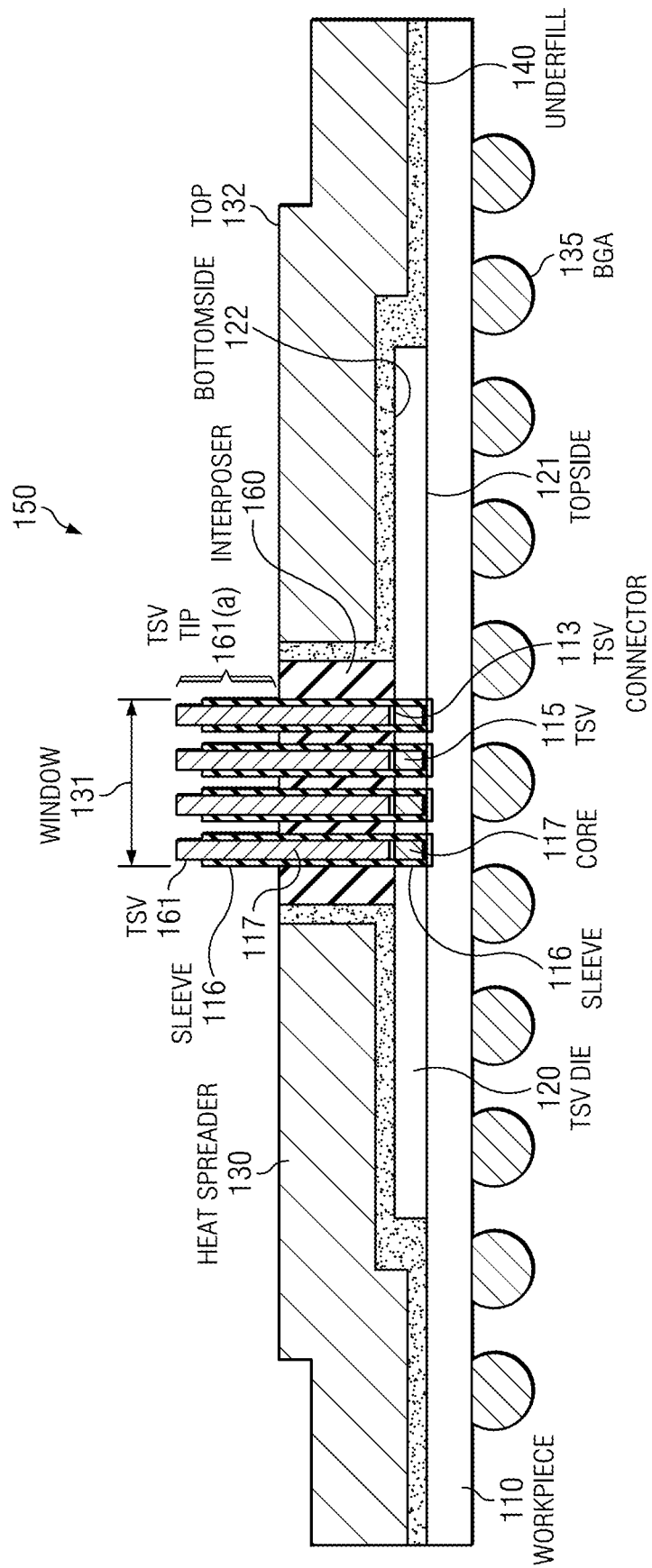
FIG. 1B is a cross sectional depiction of another example electronic assembly including a workpiece, a TSV die attached to the workpiece topside down, a heat spreader having an inner open window on the bottomside of the TSV die, and bonding features shown an interposer comprising a plurality of TSVs that protrude from the inner window to a height above a height of the top of the heat spreader, according to an example embodiment.

FIG. 1B is a depiction of an example electronic assembly 150 including a workpiece 110, a TSV die 120 attached to the workpiece with its topside 121 down, a heat spreader 130 having an inner open window 131 on the bottomside 122 of the TSV die, and bonding features shown provided by an interposer 160 comprising a plurality of TSVs 161 including TSV tips 161(a) that protrude from the inner open window 131 to a height above a height of the heat spreader 130, according to an example embodiment. In this embodiment the TSVs 115 on the TSV die 120 do not protrude from the bottomside 122 of the TSV die 120, and the bonding features coupled to TSV connectors 113 on the bottomside 122 of the TSV die 120 comprise the interposer 160.

The TSV connectors 113 may (e.g., see FIG. 1A), or may not, protrude from the bottomside 122 of the TSV die 120. In one particular example, the TSV connectors 113 on the bottomside 122 of the TSV die 120 can comprise metal pads that are coupled to TSVs 115 that do not protrude from the bottomside 122 of the TSV die 120 by a redistribution layer, which results in the TSV connectors being laterally displaced from the TSVs 115. In one embodiment, the interposer 160 is 250 to 400 μm thick, the heat spreader 130 has a thickness that approaches the thickness of the interposer 160, and the TSV tips 161(a) extend about 5 μm to 10 μm above the height of the top 132 of the heat spreader 130.

FIG. 2 is a depiction of a stacked die SIP 200 that comprises the electronic assembly 150 shown in FIG. 1B having a top die 210 thereon, where the workpiece 110 includes a BGA 135 that is coupled to a PCB 230, according to an example embodiment. The top die 210 is shown including optional TSVs 215 that allows another die (not shown) to be attached to the top die 210. Underfill 240 is shown between the top die 210 and the heat spreader 130/interposer 160.

FIGS. 3A-C shows depictions following sequential steps in an example assembly method to form a plurality of the electronic assemblies 150 shown in FIG. 1B, according to an example embodiment. FIG. 3A depicts a TSV die 120 attached to a workpiece 110 shown as a package substrate, such as to a package substrate panel (or strip). Thermocompression (TC) bonding may be used for the attachment. FIG. 3B depicts the intermediate structure after attaching an interposer 160 including TSVs 161 to the TSV connectors 113 on the bottomside 122 of the TSV die 120 and dispensing underfill 140 on the bottomside 122 of the TSV die 120 lateral to the interposer 160.

FIG. 3C depicts the intermediate structure after attaching a heat spreader 160 having an optional protection sheet 191 attached thereon on an interposer 160 on the intermediate structure shown in FIG. 3B after curing in a curing tool for flowing and curing of the underfill 140. Typical example conditions for curing the underfill 140 are 150° C. for 1 hour. The entire intermediate assembly can be inserted between the upper and lower tools and pressed and cured. The flatness and height of the assembly is controlled by the tools and any excess underfill material 140 can flow out from the side of the heat spreader 130, which creates a fillet. The protection sheet 191 can comprise a polymer sheet, such as used in film assist molding, that can prevent overflow of underfill material 140 between TSV die 120 and the heat spreader 130 out from the open window 131.

Ball attach to form BGA 135 on workpiece 110 can follow. The workpiece 110 can be singulated to provide a plurality of the electronic assemblies 150 shown in FIG. 1B. After removing the protective sheet 191 the electronic assembly 150 may be tested using the TSV tips 161(a) of the interposer 160 for electrical contact to one side of electronic assembly (coupled to the TSV connectors 113 which coupled to the TSVs 115 on the bottomside 122 of the TSV die 120) and the BGA 135 for electrical contact to the other side of electronic assembly 150 (coupled to the topside 121 of the TSV die 120).

A top die then may be assembled onto disclosed electronic assemblies after singulation including electronic assembly 100 shown in FIG. 1A or electronic assembly 150 shown in FIG. 1B to form stacked die SIPs. In one SIP flow, the protection sheet 191 is removed, and underfill material is then dispensed on the heat spreader 130. A top die 210 (see FIG. 5 described below), such as a memory (module or die) can then be connected to the interposer 160 or protruding TSV tips 115(a) from the TSV die 120.

In some other embodiments, the heat spreader 130 is attached to the workpiece 110 using a thermal interface material that has a relatively high thermal conductivity compared to the underfill material 140. The underfill material 140 is a dielectric since it is applied to an electrical contact region. On the other hand, for attaching the heat spreader 130 laterally, a high thermal conductivity is generally desirable. For example, a thermal interface material (TIM), such as a ceramic filler, may be used.

Figure 4:
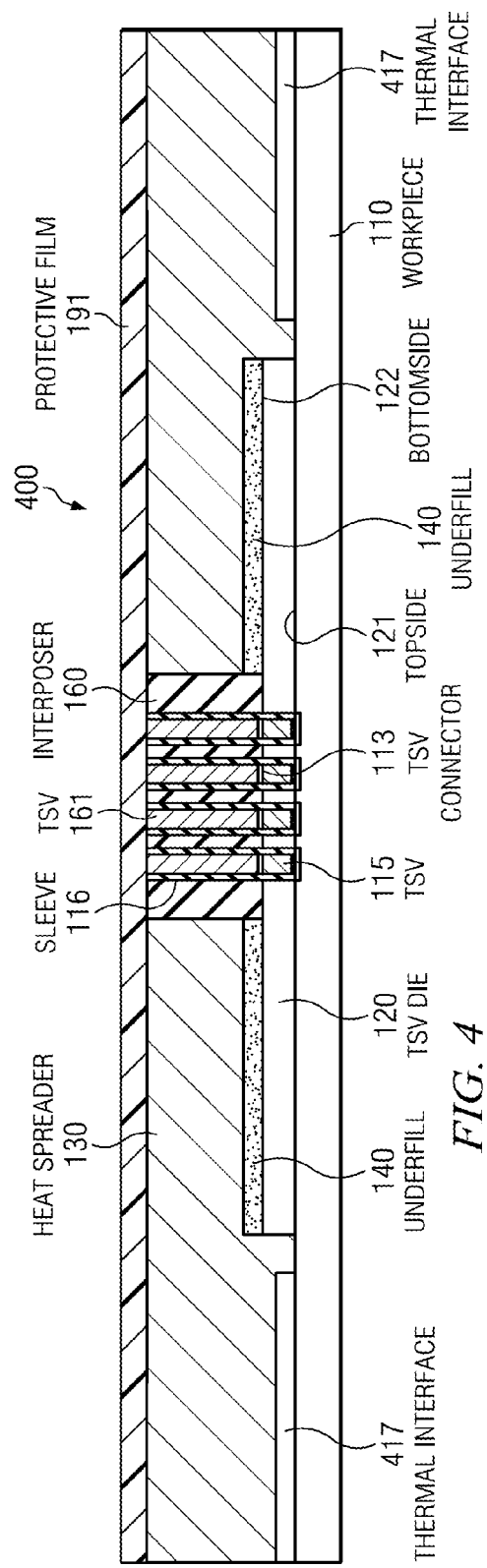
FIG. 4 shows a cross sectional depiction of an example electronic assembly that includes a thermal interface material between the heat spreader and a workpiece, that is lateral to underfill, according to an example embodiment.

FIG. 4 shows a cross sectional depiction of an example electronic assembly 400 that includes a TIM 417 such as a ceramic filler between the heat spreader 130 and the workpiece 110, that is lateral to the underfill 140. This embodiment adds an additional step, but allows more flexibility in adhesive material property selection that improves heat dissipation.

Figure 5:
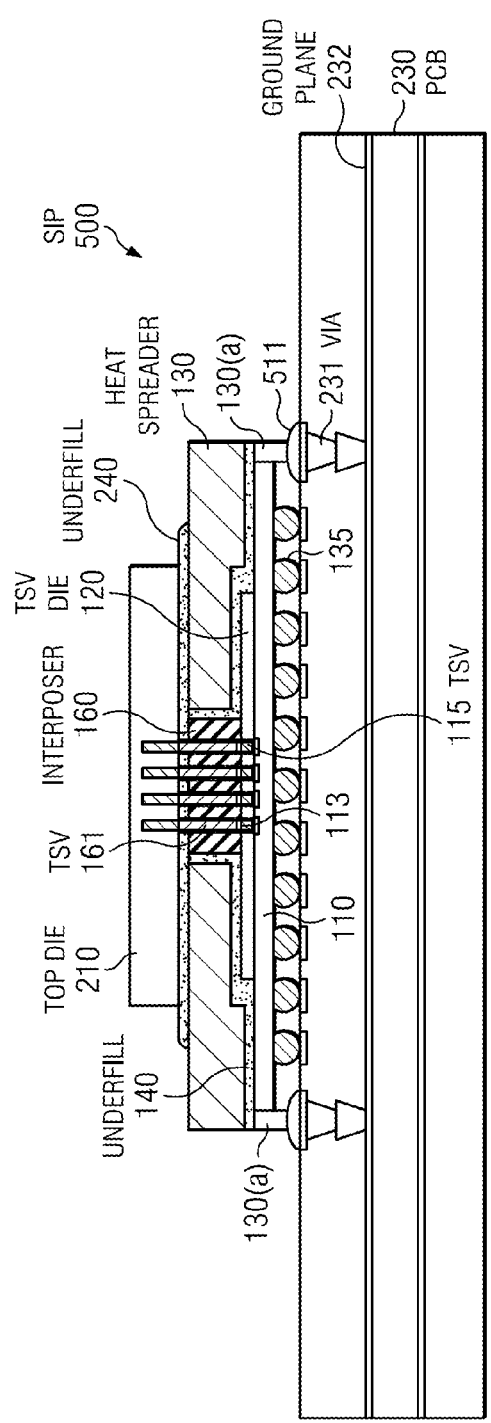
FIGS. 5 and 6 illustrate cross sectional depictions of some example stacked die SIPs that provide enhanced power dissipation capability according to example embodiments.
Figure 6:
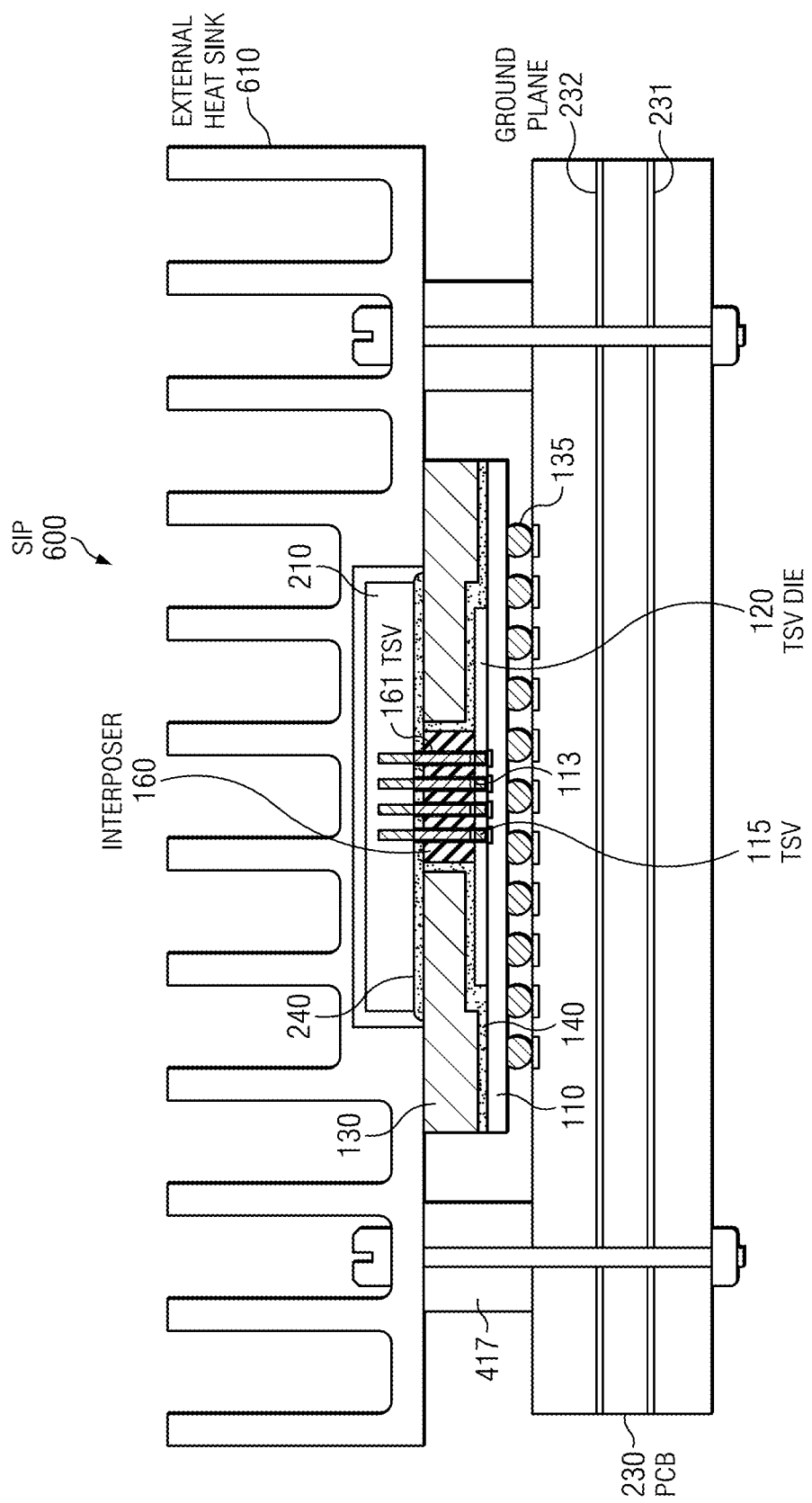

FIGS. 5 and 6 illustrate cross sectional depictions for some example stacked die SIPs, 500 and 600, respectively, that provide enhanced power dissipation capability. The heat spreader 130 shown in FIG. 5 has vertical portions 130(a) that extend toward the top surface of the PCB 230, that are attached using an electrically conductive material 511 such as solder or an electrically conductive adhesive to the top surface of the PCB 230, and are grounded to the GND plane 232 of the PCB 230 through PCB vias 231. This embodiment provides improved electromagnetic interference (EMI) shielding and improved power dissipation. SIP 600 shown in FIG. 6 is shown having an attached external heat sink 610.

Figure 7:
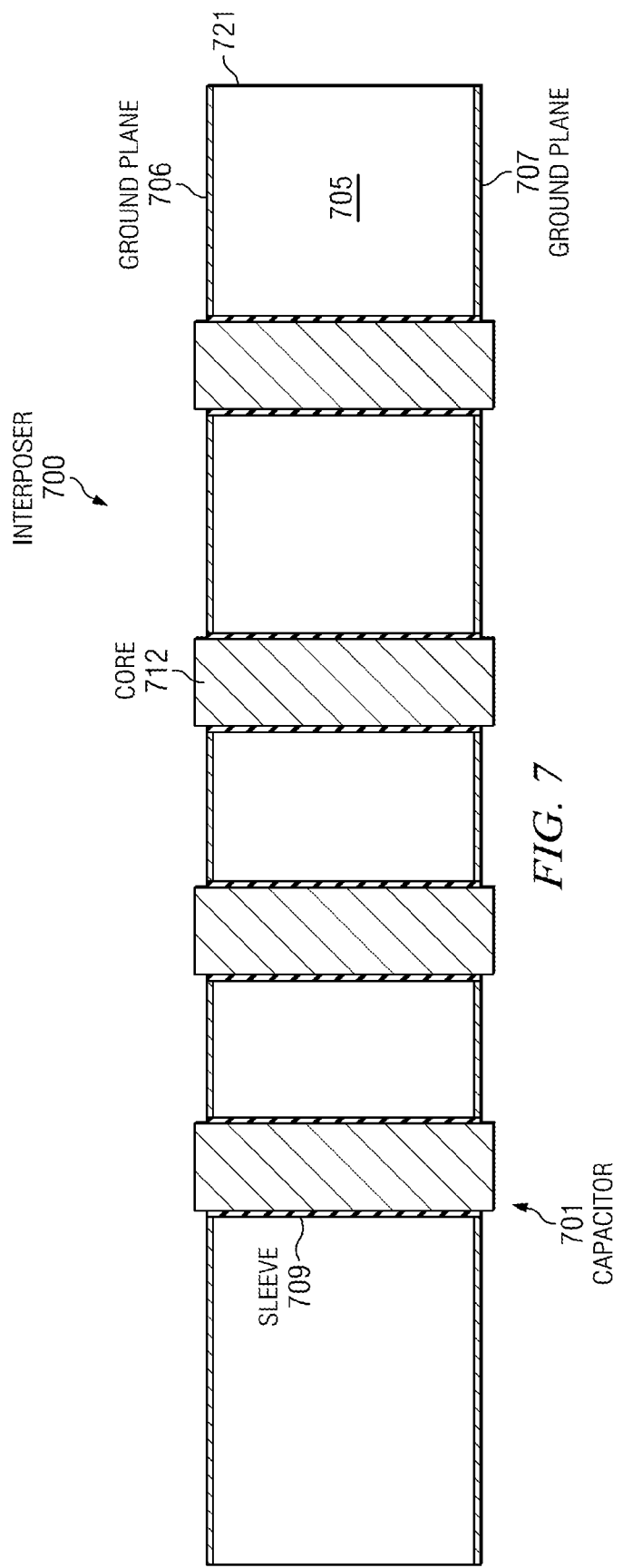
FIG. 7 illustrates a cross sectional depiction of an example interposer including integrated TSV-based capacitors, according to an example embodiment.

FIG. 7 illustrates a cross sectional depiction of an example interposer 700 that includes a substrate 705 and a plurality of integrated TSV-based capacitors 701, according to an example embodiment. Interposer 700 generally also includes TSVs for connection to devices above and below interposer 700 (not shown for simplicity). Both the top surface 721 and the bottom surface 722 of the interposer 700 have respective GND planes 706 and 707. The TSV core metal 712 of the TSV-based capacitors 701 are electrically isolated from the substrate 705 (e.g., silicon) and thus the GND planes 706 and 707 by a thin dielectric sleeve 709, such as a thermal silicon oxide or a high-k (k-value at least 10) dielectric, that can be as thin as 5 nm equivalent oxide thickness (EOT) depending on application (and voltage range of use). With the interposer structure shown in FIG. 7, it is possible to build integrated TSV-based capacitors having high capacitance values between the TSV core 712 and the substrate 705.

By integrating a TSV-based capacitor into a disclosed interposer, it is possible to improve signal/power integrity substantially. It is also possible to connect the GND planes 706 or 707 of the interposer 700 to a heat spreader and combine this embodiment with other disclosed embodiments, such as those shown in FIG. 4B or FIG. 5.

The active circuitry formed on the active semiconductor die comprise circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An electronic assembly:
    a workpiece;
    a through substrate via (TSV) die including a substrate and a plurality of TSVs, a topside and a bottomside having TSV connectors thereon, wherein said TSV die is attached to said workpiece with said topside on said workpiece;
    a heat spreader having an inner open window on said bottomside of said TSV die, and
    bonding features coupled to said TSV connectors or including said TSV connectors, wherein said bonding features protrude from said inner open window to a height above a height of a top of said heat spreader.

2. The electronic assembly of claim 1, wherein said TSV connectors comprise protruding TSV tips, and wherein said bonding features comprise said TSV connectors.

3. The electronic assembly of claim 1, wherein said bonding features comprise an interposer comprising a plurality of TSVs.

4. The electronic assembly of claim 3, wherein said interposer includes at least one integrated TSV-based capacitor.

5. The electronic assembly of claim 1, further comprising a top die on said heat spreader, wherein said top die is coupled to said bonding features.

6. The electronic assembly of claim 5, further comprising an external heat sink on said top die, wherein lateral to said heat spreader said external heat sink is thermally coupled to said workpiece by a thermal interface material.

7. The electronic assembly of claim 5, wherein said heat spreader includes vertical portions that extend toward a top surface of said workpiece, and wherein said vertical portions are attached by an electrically conductive material to said top surface of said workpiece and are grounded to a ground plane in said workpiece through workpiece vias.

8. The electronic assembly of claim 1, further comprising a first underfill material between said heat spreader and said bottomside of said TSV die and a second underfill material having a thermal conductivity greater than a thermal conductivity of said first underfill material between said heat spreader and said workpiece lateral to said TSV die.

9. The electronic assembly of claim 1, wherein said TSV connectors do not protrude from said bottomside.

10. The electronic assembly of claim 1, wherein said workpiece comprises an organic substrate having a ball grid array (BGA) on a side opposite said TSV die.

11. The electronic assembly of claim 1, further comprising a removable protection sheet on said heat spreader.

12. An electronic assembly, comprising:
a workpiece;
a through substrate via (TSV) die including a substrate and a plurality of TSVs, a topside and a bottomside having TSV connectors thereon, wherein said TSV die is attached to said workpiece with said topside on said workpiece;
a heat spreader having an inner open window on said bottomside of said TSV die, and
an interposer including a plurality of TSVs in said open window coupled to said TSV connectors on said bottomside of said TSV die.

13. The electronic assembly of claim 12, wherein said interposer includes at least one integrated TSV-based capacitor.

14. The electronic assembly of claim 12, further comprising a top die on said heat spreader, wherein said top die is coupled to said plurality of TSVs of said interposer.

15. A method of forming an electronic assembly, comprising:
attaching a through substrate via (TSV) die including a substrate and a plurality of TSVs, a topside and a bottomside having TSV connectors thereon with said topside down onto a workpiece, and
attaching a heat spreader having an inner open window on said bottomside of said TSV die, wherein said bonding features coupled to said TSV connectors or including said TSV connectors protrude from said inner open window to a height above a height of a top of said heat spreader.

16. The method of claim 15, wherein said TSV connectors comprise protruding TSV tips, and wherein said bonding features comprise said TSV connectors.

17. The method of claim 15, further comprising:
attaching an interposer comprising a plurality of TSVs including protruding TSV tips to a bottomside of said TSV die, wherein said plurality of TSVs are coupled to said TSV connectors of said TSV die, and
dispensing underfill lateral to said interposer including on said bottomside of said TSV die.

18. The method of claim 17, wherein said interposer includes at least one integrated TSV-based capacitor.

19. The method of claim 15, further comprising attaching a top die on said heat spreader, wherein said top die is coupled to said bonding features.

20. The method of claim 15, wherein said workpiece comprises an organic substrate having a ball grid array (BGA) on a side opposite said TSV die.

* * * * *